(12) United States Patent
Higuchi et al.

US008228019B2

(10) Patent No.: US 8,228,019 B2
(45) Date of Patent: Jul. 24, 2012

(54) OUTPUT FILTER AND MOTOR DRIVE SYSTEM INCLUDING THE SAME

(75) Inventors: Tsuyoshi Higuchi, Fukuoka (JP); Kenji Yamada, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 127 days.

(21) Appl. No.: 12/875,129

(22) Filed: Sep. 3, 2010

(65) Prior Publication Data

US 2011/0050135 A1    Mar. 3, 2011

Related U.S. Application Data

(63) Continuation of application No. PCT/JP2009/053275, filed on Feb. 24, 2009.

(30) Foreign Application Priority Data

Mar. 4, 2008    (JP) .............................. P. 2008-052911

(51) Int. Cl.
   *H02P 23/00*    (2006.01)
(52) U.S. Cl. ............ 318/722; 307/89; 307/105; 333/12; 333/166; 361/118
(58) Field of Classification Search .................. 318/800, 318/801, 722, 807, 727, 701, 432, 400.01, 318/400.23, 400.24; 361/118; 363/34, 40, 363/47, 95, 108, 173, 175; 307/105, 89; 333/12, 166
See application file for complete search history.

(56) References Cited

U.S. PATENT DOCUMENTS

| | | | | |
|---|---|---|---|---|
| 5,619,079 A | * | 4/1997 | Wiggins et al. | ................. 307/89 |
| 5,990,654 A | * | 11/1999 | Skibinski et al. | ............. 318/800 |
| 6,028,405 A | * | 2/2000 | Kume et al. | ............. 318/400.24 |
| 6,208,098 B1 | * | 3/2001 | Kume et al. | ............. 318/400.25 |

(Continued)

FOREIGN PATENT DOCUMENTS

JP    09-084357    3/1997

(Continued)

OTHER PUBLICATIONS

International Search Report for International Application No. PCT/JP2009/053275, Apr. 21, 2009.

(Continued)

*Primary Examiner* — Walter Benson
*Assistant Examiner* — Antony M Paul
(74) *Attorney, Agent, or Firm* — Ditthavong Mori & Steiner, P.C.

(57) ABSTRACT

An output filter includes a polyphase common-mode filter having a polyphase common-mode choke connected to an output of a power converter at one end, a first polyphase capacitor connected to the other end of the polyphase common-mode choke at one end, and a neutral-point detecting transformer connected to the other end of the first polyphase capacitor at one end; a capacitor/resistor series-connected body connected to a frame ground of the power converter at one end and connected to the other end of the neutral-point detecting transformer at the other end; and a polyphase normal-mode filter having a polyphase normal-mode choke connected to the other end of the polyphase common-mode choke at one end, and a second polyphase capacitor connected to the other end of the polyphase normal-mode choke at one end and having the other ends connected together and further connected to the one end of the capacitor/resistor series-connected body.

6 Claims, 12 Drawing Sheets

U.S. PATENT DOCUMENTS 7,606,052 B2 * 10/2009 Akagi .............................. 363/40
2006/0227483 A1 * 10/2006 Akagi ........................... 361/118

FOREIGN PATENT DOCUMENTS

| JP | 3596694 B2 | 3/1997 |
| JP | 11-196565 | 7/1999 |
| JP | 2001-069762 | 3/2001 |
| JP | 3466118 B2 | 3/2001 |
| JP | 2001-204136 | 7/2001 |
| JP | 2007-068311 | 3/2007 |

OTHER PUBLICATIONS

Written Opinion of the International Searching Authority for International Application No. PCT/JP2009/053275, Apr. 21, 2009.

* cited by examiner

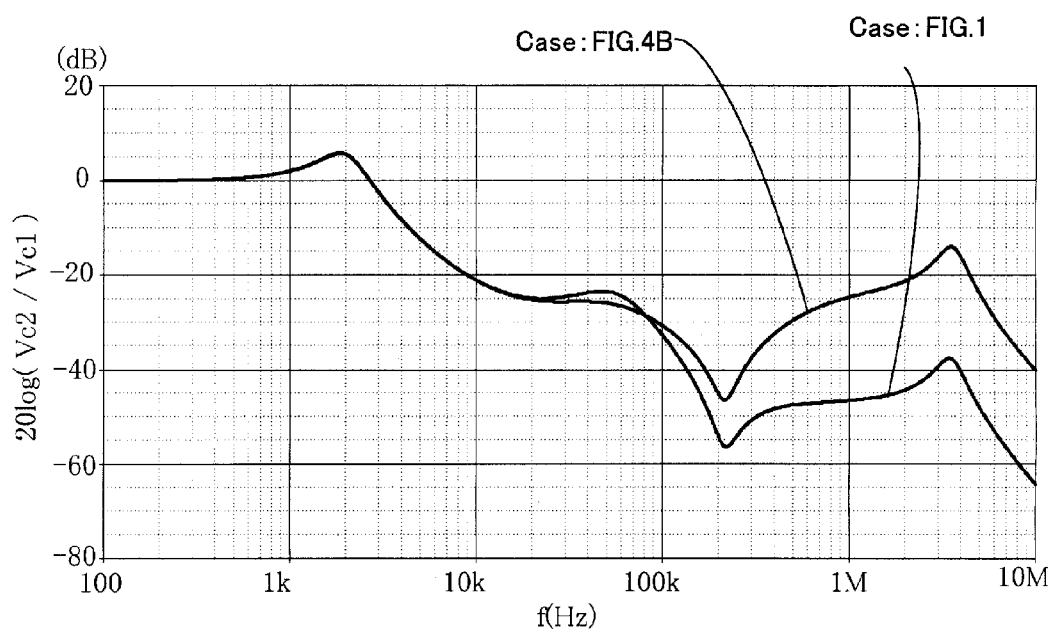

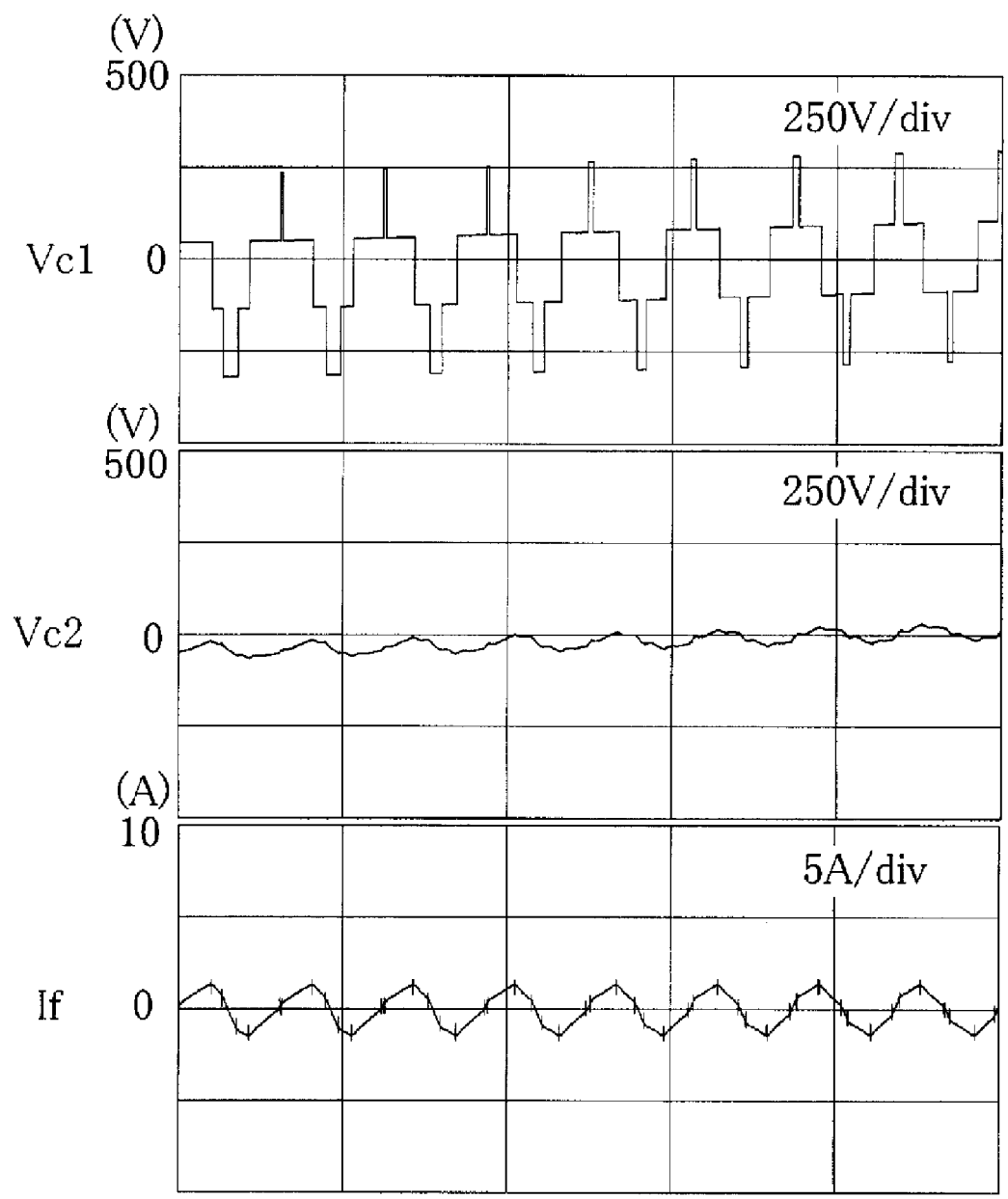

OUTPUT FILTER AND MOTOR DRIVE SYSTEM INCLUDING THE SAME

CROSS-REFERENCE TO RELATED APPLICATIONS

The present application is a continuation application of PCT/JP2009/053275, filed Feb. 24, 2009 titled "OUTPUT FILTER AND POWER CONVERTER USING OUTPUT FILTER", which claims priority to Japanese Patent Application No. 2008-052911, filed Mar. 4, 2008. The contents of these applications are incorporated herein by reference in their entirety.

BACKGROUND OF THE INVENTION

1. Field of the Invention

The present invention relates to output filters and motor drive systems.

2. Discussion of the Background

For example, Japanese Unexamined Patent Application Publication No. 2001-069762 discloses a filter that includes a relatively small common-mode choke coil and capacitors. The disclosed filter is capable of reducing high-frequency noise and leak current in an electric apparatus, such as a motor, without causing an increase in current flowing through a switching element resulting from an alternating-current short circuit between lines, and without resonance between lines and at a neutral point.

SUMMARY OF THE INVENTION

According to one aspect of the present invention, a motor drive system includes a motor, a power converter configured to input power from an alternating-current power supply and supply power to the motor, and an output filter connected between the power converter and the motor. The output filter includes a polyphase common-mode filter connected to an output of the power converter at one end, a polyphase normal-mode filter connected to the other end of the polyphase common-mode filter at one end and connected to the motor at the other end, and a capacitor/resistor series-connected body connected to a frame ground of the power converter at one end and connected to the polyphase common-mode filter at the other end. The output filter connects the frame ground of the power converter, the capacitor/resistor series-connected body, and the polyphase normal-mode filter to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a graph showing a simulation result indicating gain characteristics of the output filter in common mode;

FIG. 9B is a graph showing a simulation result of common-mode voltages and a filter current in common mode of the output filter in the motor drive system according to the first embodiment of the present invention;

DESCRIPTION OF THE EMBODIMENTS

Figure 1:
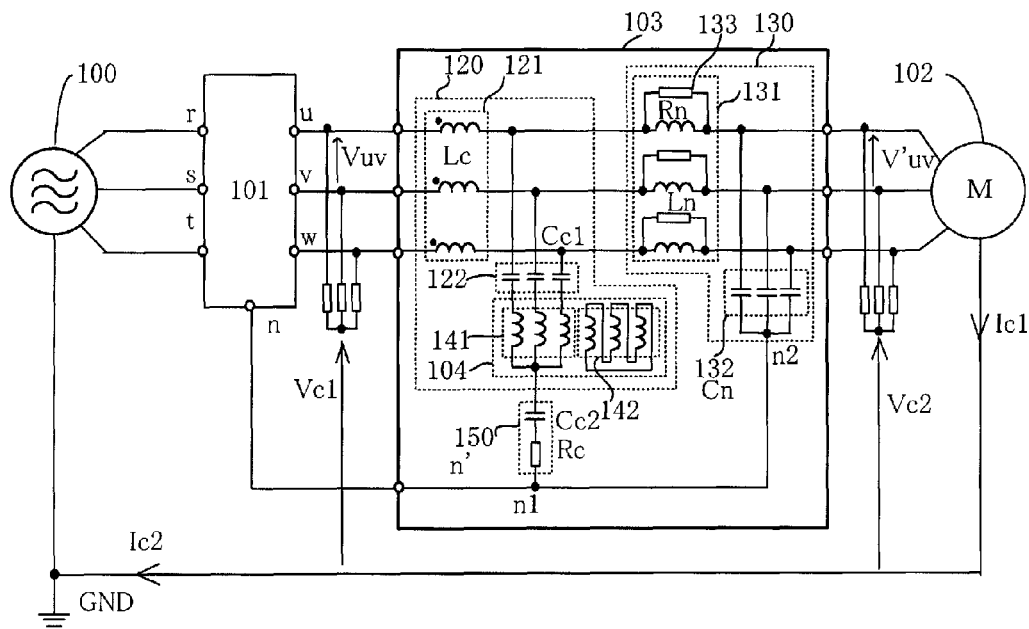
FIG. 1 is a schematic configuration diagram of a motor drive system according to a first embodiment of the present invention.

Embodiments will now be described with reference to the accompanying drawings, wherein like reference numerals and symbols designate corresponding or identical elements throughout the various drawings.

FIG. 1 is a schematic configuration diagram of a motor drive system according to a first embodiment of the present invention.

Referring to FIG. 1, the motor drive system includes a power converter 101 and an output filter 103. The motor drive system inputs power from an alternating-current power supply 100, and supplies power to a motor 102 to drive it.

The output filter 103 includes a polyphase common-mode filter 120, a polyphase normal-mode filter 130, and a capacitor/resistor series-connected body 150.

The polyphase common-mode filter 120 includes a polyphase common-mode choke 121, a first polyphase capacitor 122, and a neutral-point detecting transformer 104 having a primary winding 141 and a delta-connected secondary winding 142.

The polyphase normal-mode filter 130 includes a polyphase normal-mode choke 131 and a second polyphase capacitor 132. A parallel resistor 133 is connected to the polyphase normal-mode choke 131.

The output filter 103 connects a return line n1 of a common-mode filter including the polyphase common-mode filter 120 and the capacitor/resistor series-connected body 150 to a neutral point n2 of the polyphase normal-mode filter 130. A connection point of the return line n1 and the neutral point n2 is connected to a frame ground of the power converter 101.

Here, a common-mode voltage upstream of the output filter 103 is denoted by Vc1, a common-mode voltage downstream of the output filter 103 is denoted by Vc2, a UV-phase line voltage upstream of the output filter 103 is denoted by $V_{UV}$, and a UV-phase line voltage downstream of the output filter 103 is denoted by $V'_{UV}$.

The output filter 103 is capable of suppressing a surge voltage at motor terminals, and of suppressing a common-mode voltage generated by switching in the power converter 101. Also, the output filter 103 is capable of providing good high-frequency characteristics.

Figure 2:
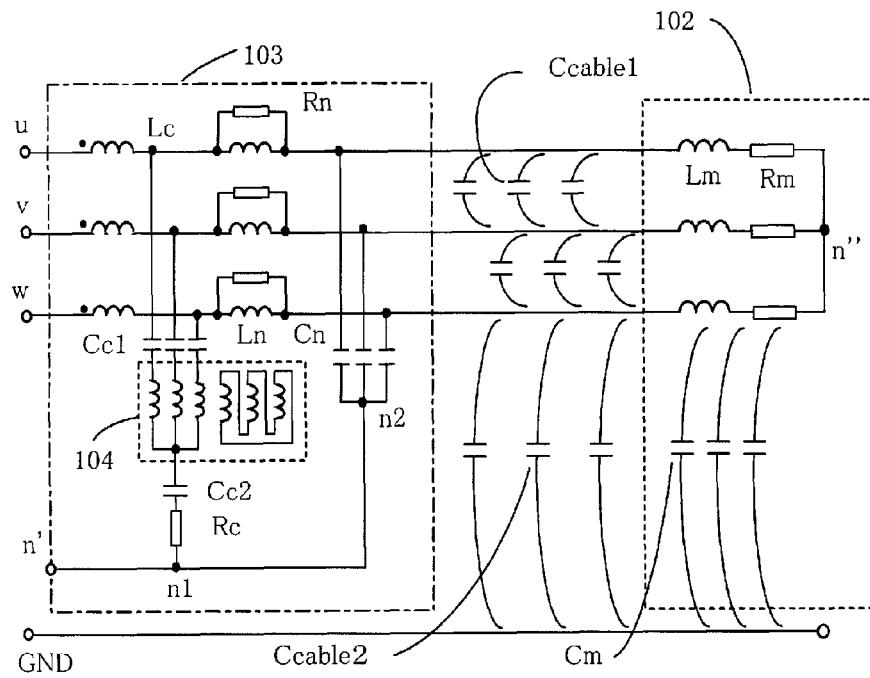
FIG. 2 illustrates an equivalent circuit of an output filter and a motor in common mode.

FIG. 2 illustrates an equivalent circuit of the output filter 103 and the motor 102 in common mode.

Referring to FIG. 2, at a connection between the output filter 103 and the motor 102, there are stray capacitances Ccable1 between power lines U, V, and W and stray capacitances Ccable2 between the power lines U, V, and W and a ground line GND. At the same time, there are stray capacitances Cm between motor windings Rm and Lm and a motor frame (or the ground line GND).

Figure 3A:
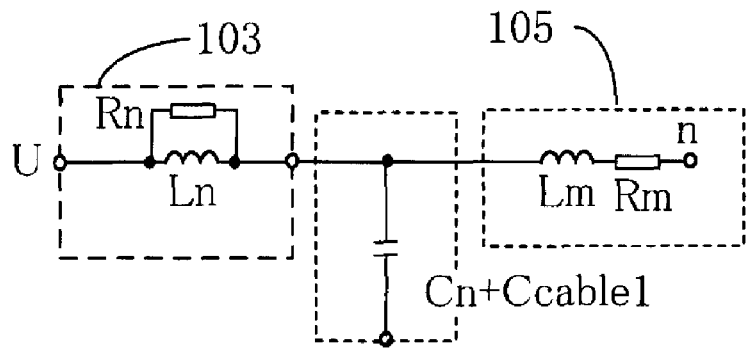
FIG. 3A illustrates a normal-mode equivalent circuit of one phase of the output filter and the motor.
Figure 3B:
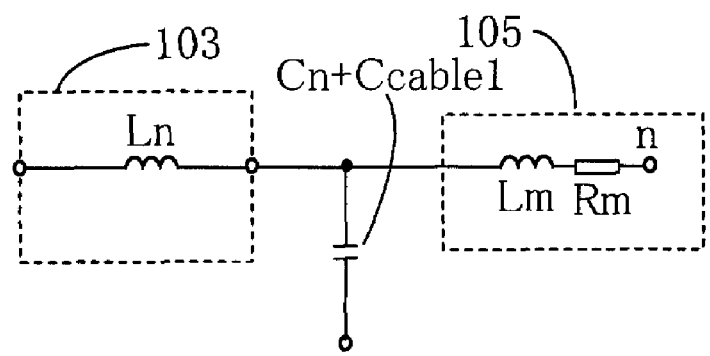
FIG. 3B illustrates a normal-mode equivalent circuit of one phase of the output filter and the motor at low frequencies.
Figure 3C:
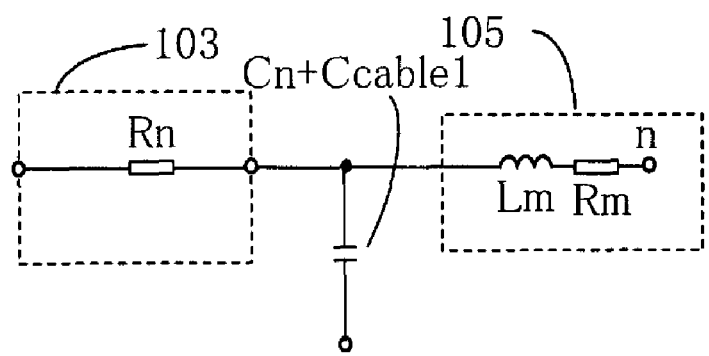
FIG. 3C illustrates a normal-mode equivalent circuit of one phase of the output filter and the motor at high frequencies.

FIG. 3A illustrates a normal-mode equivalent circuit of one phase of the output filter 103 and the motor 102. FIG. 3B illustrates a normal-mode equivalent circuit of one phase of the output filter 103 and the motor 102 at low frequencies. FIG. 3C illustrates a normal-mode equivalent circuit of one phase of the output filter 103 and the motor 102 at high frequencies.

The filter characteristics of the output filter 103 are different depending on whether the output filter 103 is in a low-frequency region or in a high-frequency region. In a low-frequency region, the impedance of a normal-mode choke Ln is smaller than that of a parallel resistor Rn, so that the parallel resistor Rn can be ignored. In a high-frequency region, the impedance of the parallel resistor Rn is smaller than that of the normal-mode choke Ln, so that the normal-mode choke Ln can be ignored.

Figure 6A:
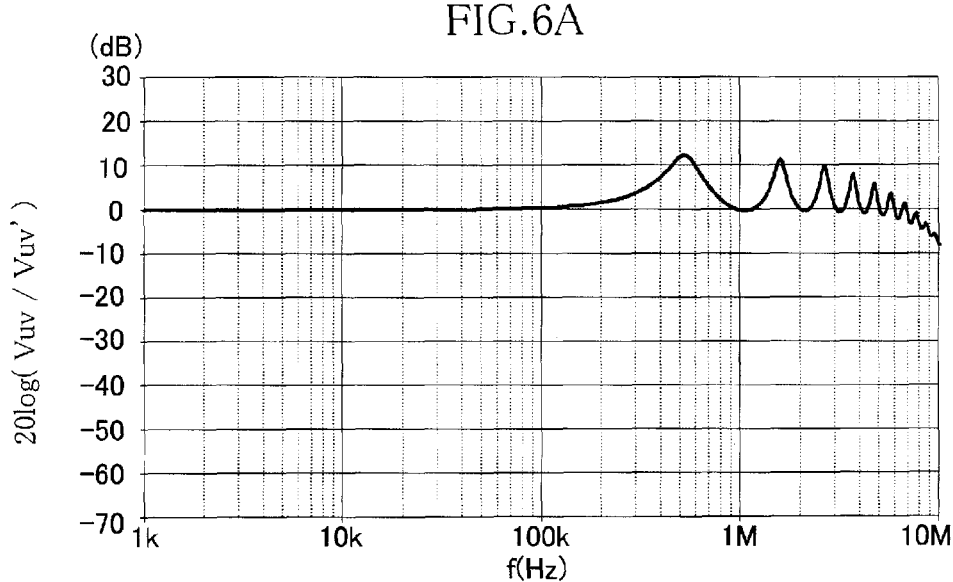
FIG. 6A is a graph showing gain characteristics between power lines U and V in the motor drive system with no output filter.
Figure 6B:
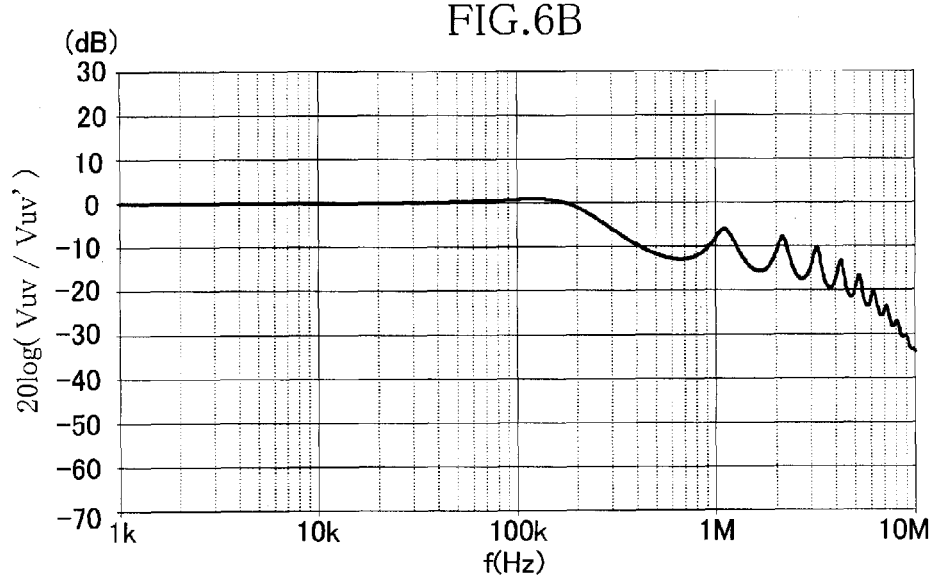
FIG. 6B is a graph showing gain characteristics in the motor drive system with the output filter according to the first embodiment of the present invention.

FIG. 6A is a graph showing gain characteristics between the power lines U and V in a motor drive system with no output filter. FIG. 6B is a graph showing gain characteristics in the motor drive system with the output filter 103 according to the first embodiment of the present invention.

A comparison between FIG. 6A and FIG. 6B shows that, in the motor drive system with the output filter 103 according to the first embodiment of the present invention, the output gain is not reduced in a low-frequency region, while a resonance phenomenon which may cause a surge voltage can be suppressed (i.e., the output gain can be reduced) in a high-frequency region.

Figure 7A:
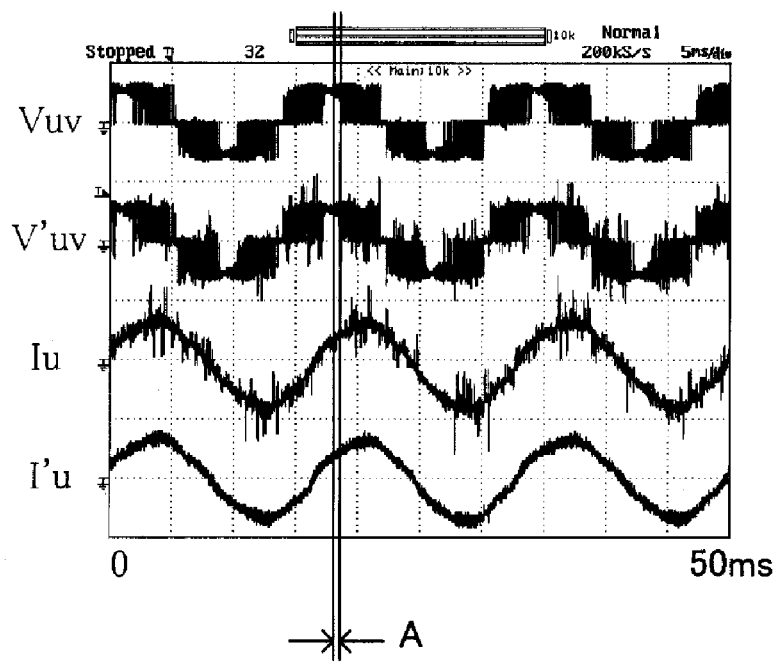
FIG. 7A is a graph showing motor terminal voltages and U-phase currents in the motor drive system with no output filter.
Figure 7B:
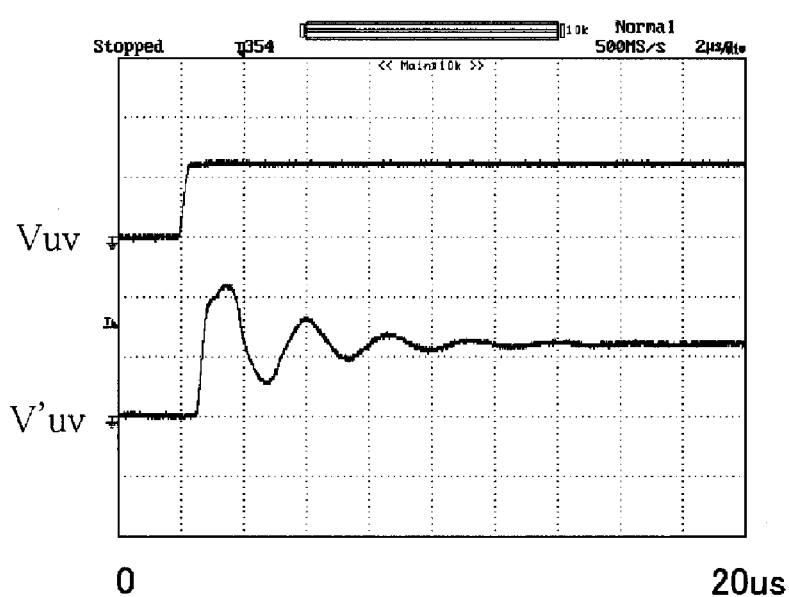
FIG. 7B is an enlarged view of a time axis A of FIG. 7A.
Figure 7C:
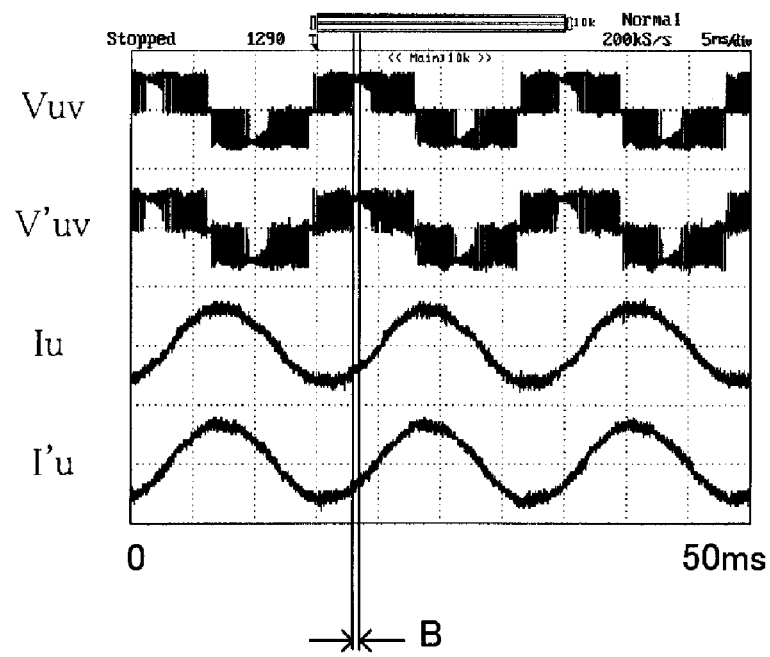
FIG. 7C is a graph showing motor terminal voltages and U-phase currents in the motor drive system with the output filter according to the first embodiment of the present invention.
Figure 7D:
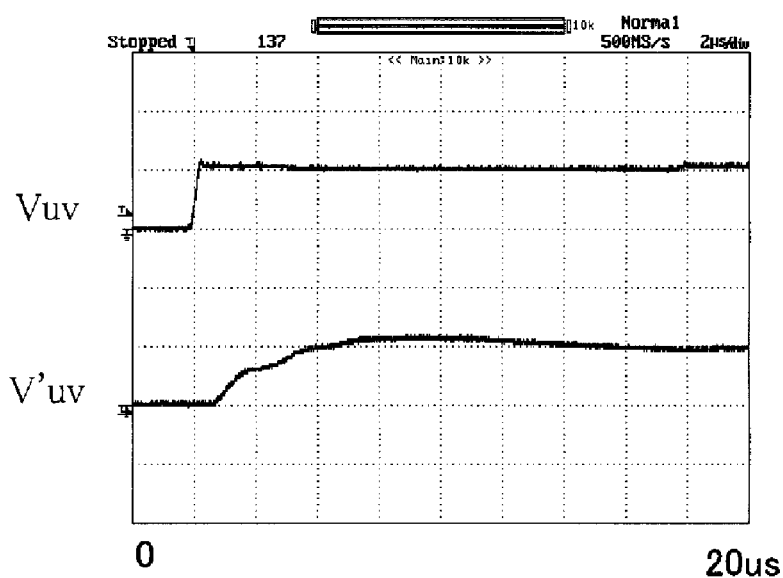
FIG. 7D is an enlarged view of a time axis B of FIG. 7C.

FIG. 7A is a graph showing motor terminal voltages and U-phase currents in the motor drive system with no output filter. FIG. 7B is an enlarged view of a time axis A of FIG. 7A. FIG. 7C is a graph showing motor terminal voltages and U-phase currents in the motor drive system with the output filter 103 according to the first embodiment of the present invention. FIG. 7D is an enlarged view of a time axis B of FIG. 7C.

A comparison of FIGS. 7A and 7B with FIGS. 7C and 7D shows that, in the motor drive system with the output filter 103 according to the first embodiment of the present invention, the output filter 103 acts as a resistor-capacitor (RC) filter for high-frequency components in normal mode, so that a surge voltage at motor terminals can be suppressed.

FIG. 7A to FIG. 7D show the UV-phase line voltage $V_{UV}$ upstream of the output filter 103 and the UV-phase line voltage $V'_{UV}$ downstream of the output filter 103 as an example of the motor terminal voltage, but similar effects can be seen in a VW-phase line voltage $V_{VW}$ and a WU-phase line voltage $V_{WU}$ upstream of the output filter 103 and a VW-phase line voltage $V'_{VW}$ and a WU-phase line voltage $V'_{WU}$ downstream of the output filter 103. Also, the U-phase currents upstream and downstream of the output filter 103 are shown as an example, but similar effects can be seen in V-phase and W-phase currents.

Figure 4A:
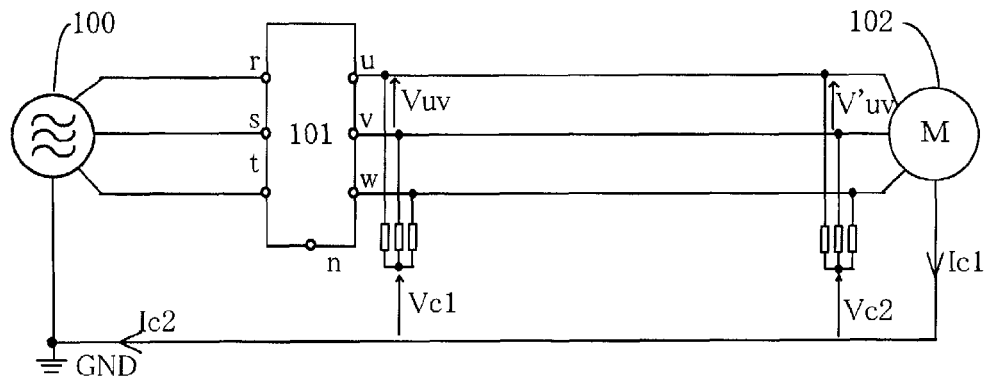
FIG. 4A is a schematic configuration diagram of a motor drive system with no output filter.
Figure 4B:
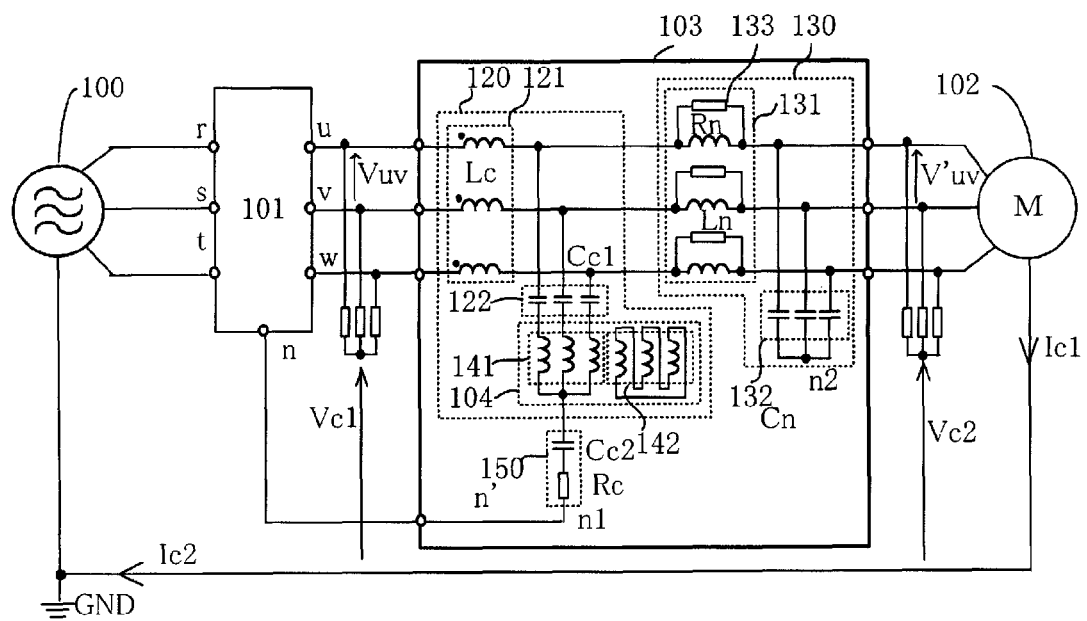
FIG. 4B is a schematic configuration diagram of a motor drive system according to a comparative example.

FIG. 4A is a schematic configuration diagram of the motor drive system with no output filter. FIG. 4B is a schematic configuration diagram of a motor drive system according to a comparative example.

Figure 5A:
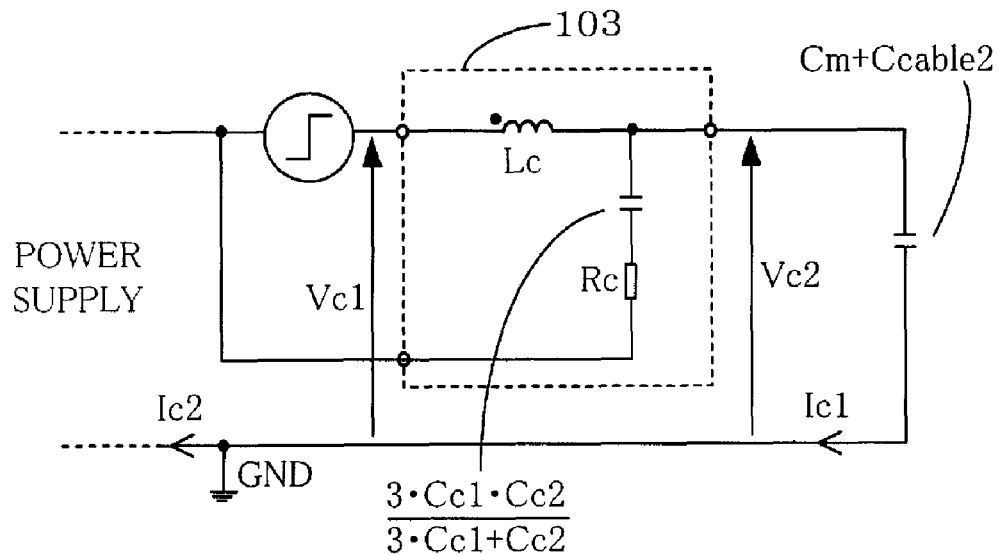
FIG. 5A illustrates a common-mode equivalent circuit between a power converter and the motor in the motor drive system according to the comparative example.
Figure 5B:
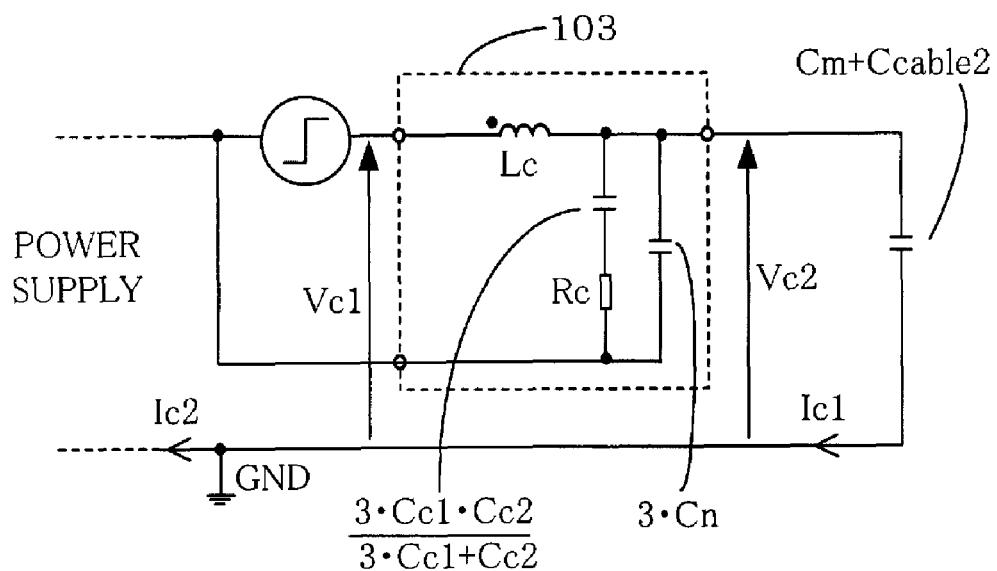
FIG. 5B illustrates a common-mode equivalent circuit between the power converter and the motor in the motor drive system according to the first embodiment of the present invention.

FIG. 5A illustrates a common-mode equivalent circuit between the power converter 101 and the motor 102 in the motor drive system according to the comparative example. FIG. 5B illustrates a common-mode equivalent circuit between the power converter 101 and the motor 102 in the motor drive system according to the first embodiment of the present invention.

As illustrated in FIG. 1, the output filter 103 in the motor drive system according to the first embodiment of the present invention connects the return line n1 of the common-mode filter including the polyphase common-mode filter 120 and the capacitor/resistor series-connected body 150 to the neutral point n2 of the polyphase normal-mode filter 130. Therefore, as illustrated in FIG. 5B, the impedance of a bypass circuit of the common-mode filter is small.

FIG. 8 is a graph showing a simulation result indicating gain characteristics of the output filter 103 in common mode.

In the output filter 103 (Case: FIG. 1) in the motor drive system according to the first embodiment of the present invention, as compared to the case of the output filter 103 (Case: FIG. 4B) in the motor drive system according to the comparative example, the impedance of the bypass circuit of the common-mode filter in a high-frequency region is smaller, so that better filter characteristics can be provided.

Figure 9A:
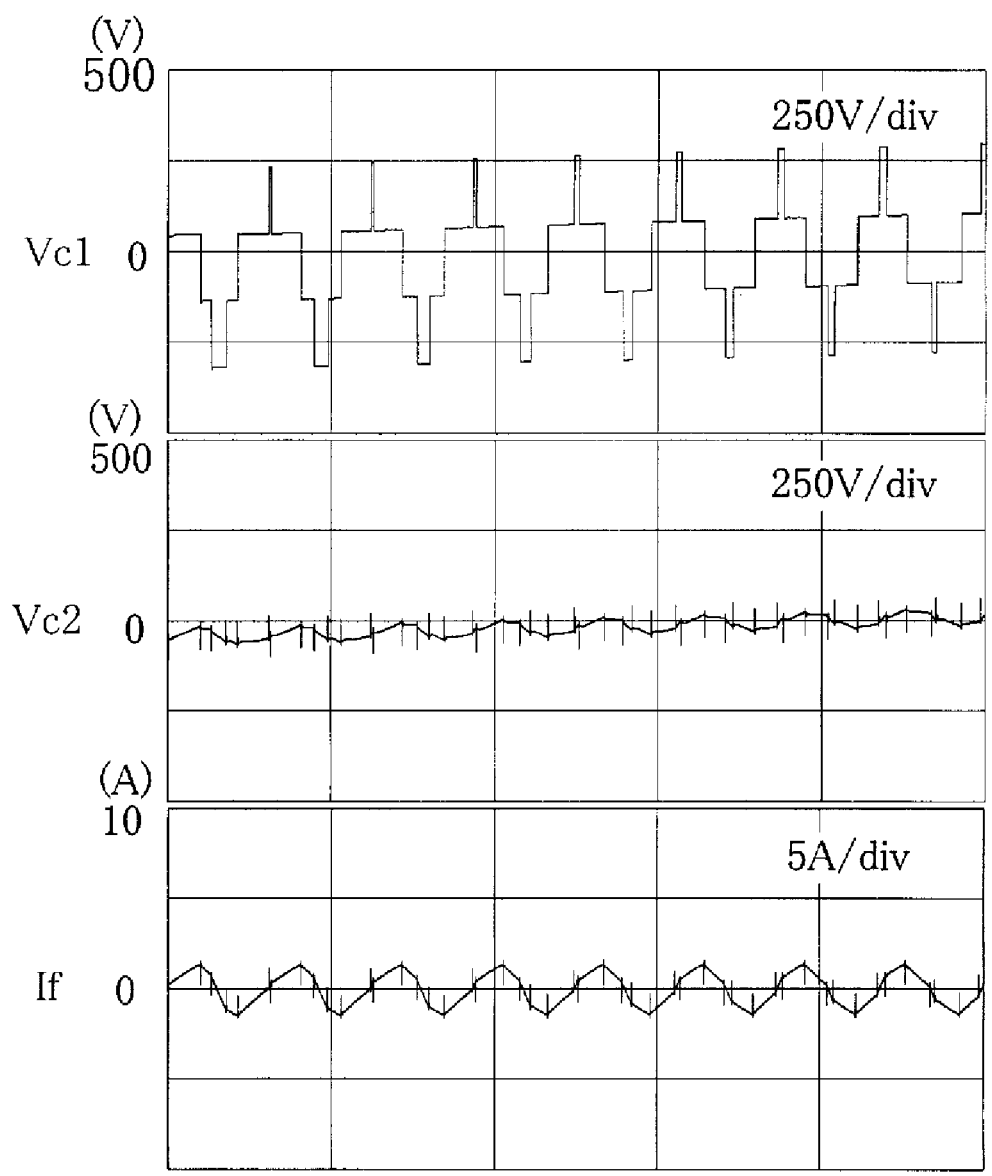
FIG. 9A is a graph showing a simulation result of common-mode voltages and a filter current in common mode of the output filter in the motor drive system according to the comparative example.

FIG. 9A is a graph showing a simulation result of the common-mode voltages Vc1 and Vc2 and a filter current If in common mode of the output filter 103 (Case: FIG. 4B) in the motor drive system according to the comparative example. FIG. 9B is a graph showing a simulation result of the common-mode voltages Vc1 and Vc2 and the filter current If in common mode of the output filter 103 (Case: FIG. 1) in the motor drive system according to the first embodiment of the present invention.

A comparison between FIG. 9A and FIG. 9B shows that, in the motor drive system with the output filter 103 according to the first embodiment of the present invention, high-frequency components of the common-mode voltage Vc2 downstream of the output filter 103 can be reduced.

Figure 10A:
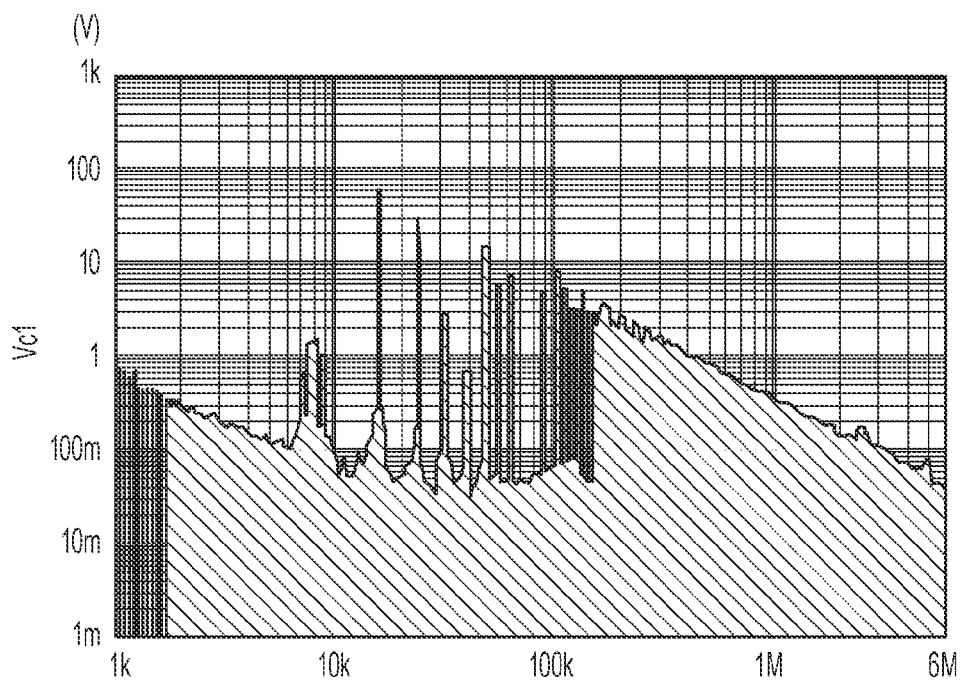
FIG. 10A is a graph showing a simulation result of frequency analysis of a common-mode voltage in the motor drive system with no output filter.
Figure 10B:
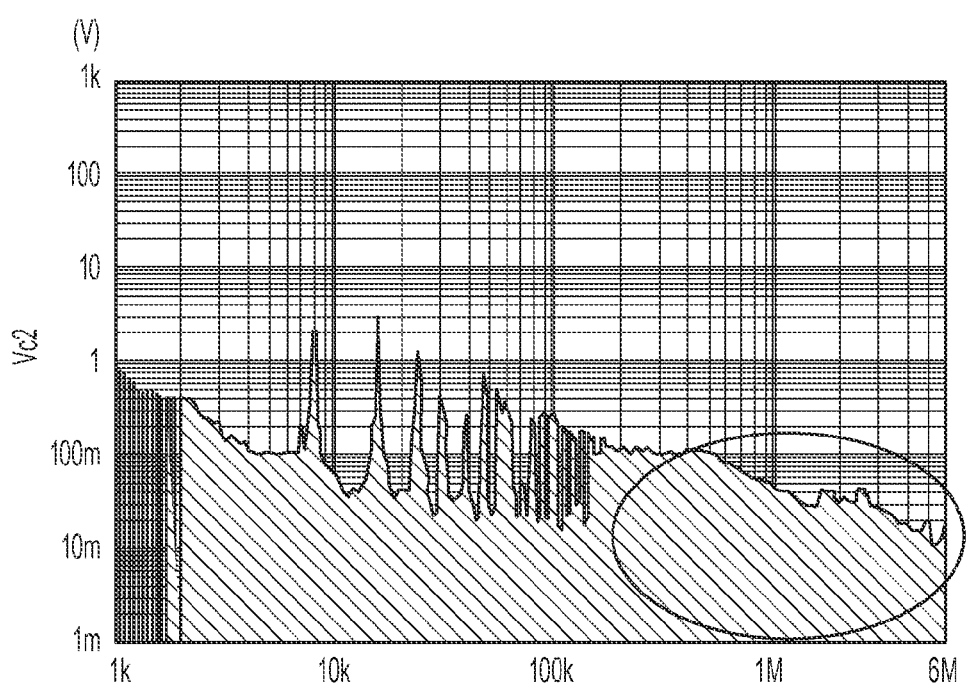
FIG. 10B is a graph showing a simulation result of frequency analysis of a common-mode voltage in the motor drive system according to the comparative example.
Figure 10C:
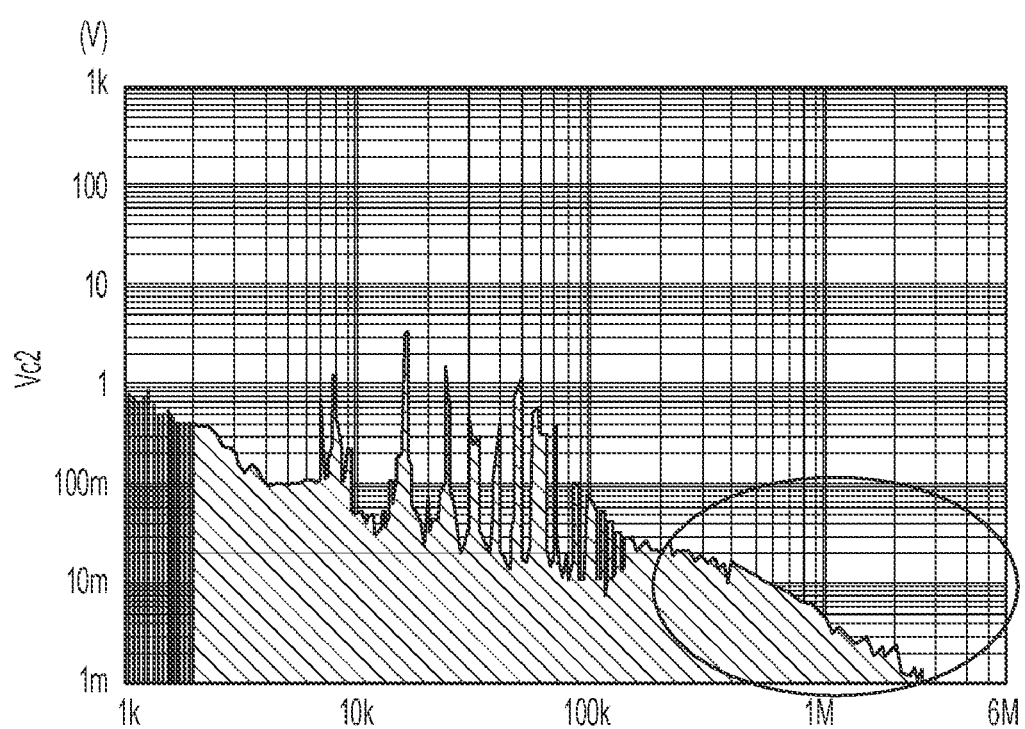
FIG. 10C is a graph showing a simulation result of frequency analysis of a common-mode voltage in the motor drive system according to the first embodiment of the present invention.

FIG. 10A is a graph showing a simulation result of frequency analysis of the common-mode voltage Vc1 in the motor drive system with no output filter. FIG. 10B is a graph showing a simulation result of frequency analysis of the common-mode voltage Vc2 in the motor drive system according to the comparative example. FIG. 10C is a graph showing a simulation result of frequency analysis of the common-mode voltage Vc2 in the motor drive system according to the first embodiment of the present invention.

A comparison of FIG. 10A, FIG. 10B, and FIG. 10C shows that, in the motor drive system with the output filter 103 according to the first embodiment of the present invention, high-frequency components of the common-mode voltage Vc2 downstream of the output filter 103 can be reduced.

As illustrated in FIG. 1, the output filter 103 in the motor drive system according to the first embodiment of the present invention connects the return line n1 of the common-mode filter including the polyphase common-mode filter 120 and the capacitor/resistor series-connected body 150 to the neutral point n2 of the polyphase normal-mode filter 130. Therefore, it is possible to reduce the impedance of the bypass circuit of the common-mode filter in a high-frequency region and to reduce high-frequency components of the common-mode voltage.

Additionally, with the output filter 103 in the motor drive system according to the first embodiment of the present invention, it is possible to reduce high-frequency components of the common-mode voltage applied to the motor 102. Therefore, it is possible to suppress degradation caused by electrolytic corrosion at a bearing of the motor 102.

Moreover, since a common-mode current flowing toward the alternating-current power supply 100 can be reduced, it is possible to reduce the size of a ground capacitor or a common-mode choke coil of an electromagnetic interference (EMI) filter used for suppressing noise terminal voltage.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An output filter comprising:
a polyphase common-mode filter connected to an output of a power converter at one end;
a polyphase normal-mode filter connected to the other end of the polyphase common-mode filter at one end and connected to a motor at the other end; and
a capacitor/resistor series-connected body connected to a frame ground of the power converter at one end,
wherein the polyphase common-mode filter includes
a polyphase common-mode choke connected to the output of the power converter at one end,
a first polyphase capacitor connected to the other end of the polyphase common-mode choke at one end, and
a neutral-point detecting transformer connected to the other end of the first polyphase capacitor at one end;
the polyphase normal-mode filter includes
a polyphase normal-mode choke connected to the other end of the polyphase common-mode choke at one end, and
a second polyphase capacitor connected to the other end of the polyphase normal-mode choke at one end and having the other ends connected together;
the capacitor/resistor series-connected body is connected to the other end of the neutral-point detecting transformer at the other end; and
the output filter connects the other ends of the second polyphase capacitor to the one end of the capacitor/resistor series-connected body.

2. The output filter according to claim 1, wherein the polyphase normal-mode filter includes a parallel resistor connected in parallel with the polyphase normal-mode choke.

3. The output filter according to claim 1, wherein the neutral-point detecting transformer includes
a primary winding configured to connect the one end of the neutral-point detecting transformer to the other end of the first polyphase capacitor and having a neutral-point detecting end as the other end; and
a secondary winding that is delta-connected.

4. A motor drive system, comprising:
a motor;
a power converter configured to input power from an alternating-current power supply and supply power to the motor; and
an output filter connected between the power converter and the motor,
wherein the output filter includes
a polyphase common-mode filter connected to an output of the power converter at one end,
a polyphase normal-mode filter connected to the other end of the polyphase common-mode filter at one end and connected to the motor at the other end, and
a capacitor/resistor series-connected body connected to a frame ground of the power converter at one end and connected to the polyphase common-mode filter at the other end;
the output filter connects the frame ground of the power converter, the capacitor/resistor series-connected body, and the polyphase normal-mode filter to each other;
wherein the polyphase common-mode filter includes
a polyphase common-mode choke connected to the output of the power converter at one end,
a first polyphase capacitor connected to the other end of the polyphase common-mode choke at one end, and
a neutral-point detecting transformer connected to the other end of the first polyphase capacitor at one end;
the polyphase normal-mode filter includes
a polyphase normal-mode choke connected to the other end of the polyphase common-mode choke at one end, and
a second polyphase capacitor connected to the other end of the polyphase normal-mode choke at one end and having the other ends connected together;
the capacitor/resistor series-connected body is connected to the other end of the neutral-point detecting transformer at the other end; and
the output filter connects the other ends of the second polyphase capacitor to the one end of the capacitor/resistor series-connected body.

5. The motor drive system according to claim 4, wherein the polyphase normal-mode filter includes a parallel resistor connected in parallel with the polyphase normal-mode choke.

6. The motor drive system according to claim 4, wherein the neutral-point detecting transformer includes
a primary winding configured to connect the one end of the neutral-point detecting transformer to the other end of the first polyphase capacitor and having a neutral-point detecting end as the other end; and
a secondary winding that is delta-connected.

* * * * *